(12) United States Patent
Nishi et al.

(10) Patent No.: US 8,273,807 B2
(45) Date of Patent: *Sep. 25, 2012

(54) CERAMIC POWDER AND USE THEREOF

(75) Inventors: Yasuhisa Nishi, Omuta (JP); Takashi Fukuda, Omuta (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/156,721

(22) Filed: Jun. 9, 2011

(65) Prior Publication Data

US 2011/0237712 A1    Sep. 29, 2011

Related U.S. Application Data

(63) Continuation of application No. 12/300,528, filed as application No. PCT/JP2007/059745 on May 11, 2007, now Pat. No. 8,063,120.

(30) Foreign Application Priority Data

May 12, 2006  (JP) ................................. 2006-133463

(51) Int. Cl.
    *C08K 7/00*  (2006.01)
(52) U.S. Cl. .................. 523/220; 524/492; 524/493
(58) Field of Classification Search ................. 523/220; 524/492, 493
    See application file for complete search history.

(56) References Cited

U.S. PATENT DOCUMENTS

| | | | |
|---|---|---|---|
| 6,365,269 B1 | 4/2002 | Atzesdorfer et al. | |
| 6,395,807 B1 | 5/2002 | Kinose et al. | |
| 8,063,120 B2 * | 11/2011 | Nishi et al. | 523/220 |
| 2003/0002514 A1 | 1/2003 | Ono et al. | |
| 2009/0306272 A1 | 12/2009 | Nishi et al. | |
| 2009/0312477 A1 | 12/2009 | Nishi et al. | |

FOREIGN PATENT DOCUMENTS

| | | |
|---|---|---|
| CN | 1288914 | 3/2001 |
| EP | 0 310 897 A2 | 4/1989 |
| EP | 0 310 897 A3 | 4/1989 |
| EP | 0 511 833 A2 | 11/1992 |
| EP | 0 511 833 A3 | 11/1992 |
| FR | 2 829 495 A1 | 3/2003 |
| JP | 62-96568 | 5/1987 |
| JP | 2002 252314 | 6/2002 |
| JP | 2003 110065 | 4/2003 |
| JP | 2003 209216 | 7/2003 |
| JP | 2003 221224 | 8/2003 |
| JP | 2004 059343 | 2/2004 |
| JP | 2005 306923 | 11/2005 |
| JP | 2005 310831 | 11/2005 |
| JP | 2006 013385 | 1/2006 |
| KR | 10-0481236 | 4/2005 |
| WO | 2006/011662 A1 | 2/2006 |
| WO | 2007/108437 A1 | 9/2007 |

OTHER PUBLICATIONS

U.S. Appl. No. 13/156,678, filed Jun. 9, 2011, Nishi, et al.
Korean Office Action issued Dec. 20, 2010, in Patent Application No. 10-2008-7027269.

* cited by examiner

*Primary Examiner* — Edward Cain
(74) *Attorney, Agent, or Firm* — Oblon, Spivak, McClelland, Maier & Neustadt, L.L.P.

(57) ABSTRACT

The present invention herein provides ceramic powder which is to be incorporated into rubber or a resin and which can be used as, for instance, a semiconductor-sealing material and for the preparation of a composition excellent in the narrow interstice-filling up property and moldability. The ceramic powder has a multiple peak-frequency type particle size distribution which has at least two peaks, as determined according to the laser diffraction-scattering type particle size distribution analyzer, wherein the maximum particle size observed for the first peak falls within the range of from 12 to 30 μm; that observed for the second peak falls within the range of from 2 to 7 μm; the content of the particles having a particle size of greater than 7 μm and less than 12 μm is not more than 18% (including 0%); and wherein the ratio (F2/F1) of the frequency value F2 of the maximum particle size for the second peak to that F1 of the maximum particle size for the first peak ranges from 0.5 to 1.3.

12 Claims, No Drawings

CERAMIC POWDER AND USE THEREOF

CROSS REFERENCE TO RELATED APPLICATION

This application is a continuation of U.S. application Ser. No. 12/300,528, filed on Aug. 4, 2009 now U.S. Pat. No. 8,063,120, which is a 371 of PCT/JP07/059745, filed on May 11, 2007, and claims priority to Japanese Patent Application No. 2006-133463, filed on May 12, 2006.

TECHNICAL FIELD

The present invention relates to ceramic powder and use thereof.

BACKGROUND ART

To cope with the requirements for the development of compact and lightweight electronic machinery and tools, which are likewise greatly improved in their performance, there has rapidly been advanced the investigation and development of smaller, thinner and high density packaged semiconductors. Accordingly, with respect to the packaged structure of such semiconductors, the conventional lead-terminal type ones such as QFP and SOP have been superseded by the area-array type ones such as BGA and LGA, which are highly effective for the realization of thinner and high density packaging. Moreover, it has been a recent trend to positively adopt a stacked-chip multi-layered structure in which a plurality of IC chips are laminated or packaged within a single semiconductor package and in other words, the structure of such a semiconductor package has increasingly been complicated and the packaging density of each semiconductor device has likewise even more rapidly become higher.

In respect of the stacked-chip multi-layered structure, there have been highlighted several problems concerning the moldability thereof due to its complicated structure. This is because, when IC chips are packaged in layers, the difference in height between the portion provided with such chips and that free of any chip on the substrate is considerably increased as compared with that observed for the conventional one chip and accordingly, the semiconductor-sealing material flows through these portions at different speeds. As a result, fine air bubbles are caught in the material at the uppermost narrower portions of the laminated chips at which the flow rate of the material is reduced to thus form un-filled areas (voids). Moreover, the number of gold wires required for the electrical connection of these chips is increased in proportion to the number of chips to be packaged, the use of long-spun gold wires is required and accordingly, problems arise such that such long-spun wires are liable to be deformed by the action of the flowing sealing material (flow resistance thereof) and this in turn results in the contact of a wire with the neighboring one and the formation of a short-circuit.

There have variously been investigated for the solution of these problems, while taking note of the improvement of molds used for molding, and the resins and the fillers used for forming a sealing material for semiconductors. In respect of the improvement of the mold used for molding, there have been proposed, for instance, a technique in which the mold is so designed that it is provided with a groove for exhausting air (air-vent), to thus prevent the formation of any void during the molding operations (Patent Document 1) and a technique in which the mold is so designed that it is provided with a member for controlling the fluidity of a sealing material to thus inhibit the occurrence of any deformation of wires and the formation of any void (Patent Document 2). Moreover, regarding the improvement of the sealing material for semiconductors, there have been proposed, for instance, a method which comprises the steps of reducing the viscosity of a resin to thus precisely control the curing time thereof at the molding temperature (Patent Document 3); a method in which a semiconductor-sealing material comprising a filler and a resin is improved in the property of filling-up narrower portions by reducing the rate of charging of the filler in the resin, lowering the viscosity of the sealing resin and further reducing the particle size of the filler; and a method in which the particle size distribution of a filler to be incorporated into a semiconductor-sealing material is adjusted so as to control the charging (or filling up) property and to simultaneously reduce the viscosity of the sealing material (Patent Document 4). However, these methods have still been insufficient and there has not yet been developed any semiconductor-sealing material which is never accompanied by the formation of voids and the deformation of distributing wires and which can accordingly be used in the sealing of semiconductors having such a stacked-chip multi-layered structure satisfactorily, as well as any ceramic powder used in the sealing material.

Patent Document 1: JP-A-2003-209216;
Patent Document 2: JP-A-2005-310831;
Patent Document 3: JP-A-2006-013382;
Patent Document 4: JP-A-2003-110065.

DISCLOSURE OF THE INVENTION

Subject to be Attained by the Invention

It is accordingly an object of the present invention to provide ceramic powder which permits the preparation of a semiconductor-sealing material excellent in the narrow interstice-filling up property and likewise excellent in the moldability; and a composition prepared by incorporating the ceramic powder into at least either a resin material or a rubber material and, in particular, a semiconductor-sealing material.

Means for Attaining the Subject

According to a first aspect of the present invention, there is thus provided ceramic powder, which has a multiple peak-frequency type particle size distribution having at least two peaks, as determined according to the laser diffraction-scattering type particle size distribution analyzer in which the maximum particle size observed for the first peak falls within the range of from 12 to 30 μm; in which the maximum particle size observed for the second peak falls within the range of from 2 to 7 μm; in which the content of the particles having a particle size of greater than 7 μm and less than 12 μm is not more than 18% (including 0%); in which the ratio (F2/F1) of the frequency value F2 of the maximum particle size observed for the second peak to the frequency value F1 of the maximum particle size observed for the first peak ranges from 0.5 to 1.3.

The ceramic powder according to the present invention is preferably provided with at least one of the following embodiments: (1) the powder has a particle size distribution having an additional third peak and the maximum particle size observed for the third peak falls within the range of from 0.1 to 0.8 μm; 2) the amount of the oversize particles as determined using the JIS Standard Sieve of 53 μm is not more than 0.5% by mass; and (3) the ceramic powder is silica powder.

In addition, according to a second aspect of the present invention, there is also provided a composition comprising at least one of a resin and rubber and the ceramic powder according to the present invention incorporated into the resin and/or rubber. According to a third aspect of the present invention, there is also provided a semiconductor-sealing material wherein the composition of the present invention is an epoxy resin composition.

Effects of the Invention

The present invention thus permits the realization of a resin composition or a rubber composition and, in particular, a semiconductor-sealing material, which has a high narrow interstice-filling up property and an excellent moldability (there is hardly observed such tendency of forming voids and the occurrence of any distributing wire deformation) even if the filling rate or factor of the ceramic powder in the resin composition or the rubber composition (these two kinds of compositions will hereunder be referred to as "composition" collectively) is increased up to a level of not less than 89% by mass.

BEST MODE FOR CARRYING OUT THE INVENTION

The present invention will be described in more detail below.

The powder according to the present invention comprises ceramic powder, and such ceramic powder includes powder of various kinds of ceramic materials such as silica, alumina, titania, magnesia, silicon nitride, aluminum nitride, and boron nitride.

These powder materials may be used alone or in any combination of at least two of them, but most preferably used herein is silica powder, in particular, amorphous silica prepared by melting crystalline silica at a high temperature, or amorphous silica prepared according to a synthetic method, since the coefficient of thermal expansion of a semiconductor element should be brought closer to that of a semiconductor-sealing material to be used; and the sealing material should be improved in the heat resistance, resistance to low temperature cycle and mold-wearing property. The rate of the amorphousness of the amorphous silica powder is preferably not less than 95% as expressed in terms of the value determined according to the method as will be detailed below.

The ceramic powder of the present invention is characterized in that it has a multiple peak-frequency type particle size distribution having at least two peaks, as determined according to the laser diffraction-scattering type particle size distribution analyzer that the maximum particle size observed for the first peak falls within the range of from 12 to 30 µm, and the maximum particle size observed for the second peak falls within the range of from 2 to 7 µm; that the content of the particles having a particle size of greater than 7 µm and less than 12 µm is not more than 18% (including 0%); and that the ratio (F2/F1) of the frequency value F2 of the maximum particle size observed for the second peak to the frequency value F1 of the maximum particle size observed for the first peak ranges from 0.5 to 1.3. The use of ceramic powder to which the foregoing characteristic properties are imparted would permit the preparation of a semiconductor-sealing material, which can maintain a high narrow interstice-filling up property and has an excellent moldability even when increasing the filling rate of the ceramic powder in a resin such as an epoxy resin up to a level of not less than 89% by mass.

A group of particles, which belong to the first peak having a maximum particle size falling within the range of from 12 to 30 µm, forms the main particles of the ceramic powder of the present invention. When the maximum particle size thereof is less than 12 µm, the viscosity of the resulting composition abruptly increases, which in turn makes it difficult to prepare a composition having an excellent moldability. On the other hand, when the maximum particle size thereof exceeds 30 µm, the viscosity of the resulting composition is reduced, but it would be very difficult for the particles to enter into narrow portions on the outermost layer of a stacked chip, which accordingly leads to the deterioration of the narrow interstice-filling up property of the composition. The maximum particle size of the particles belonging to the first peak preferably ranges from 15 to 25 µm. Patent Document 4 discloses the ceramic powder which has such a multiple-peak type particle size distribution that the maximum particle size of particles belonging to a first peak ranges from 32.2 to 42.3 µm, but the range is completely different from that observed for the present invention. In this respect, the content of the particles whose particle size falls within the range of from 12 to 30 µm is preferably not less than 25% by mass and particularly preferably not less than 35% by mass. Moreover, it is suitable that the upper limit of the content thereof is, for instance, 60% by mass.

A group of particles, which belong to the second peak having a particle size falling within the range of from 2 to 7 µm, would enter into the interstices formed between the group of particles belonging to the first peak and thus make the packing structure of the particles denser to further improve the packing property of the resulting ceramic powder and to thereby further reduce the viscosity of the resulting composition. Therefore, the particle size of these particles belonging to the second peak preferably falls within the range of from 3 to 6 µm. In particular, when the ratio (F2/F1) of the frequency value F2 of the maximum particle size observed for the second peak to the frequency value F1 of the maximum particle size observed for the first peak ranges from 0.5 to 1.3 and preferably 0.6 to 1.2, the ceramic powder of the present invention can be improved so as to substantially reduce the viscosity thereof to a desired level and to further improve the moldability of the same. In this respect, it would be estimated that the F2/F1 value of the multiple peak type particle size distribution disclosed in Patent Document 4 is not less than 1.9. In addition, the content of the particles, which belong to the second peak having a particle size falling within the range of from 2 to 7 µm, is preferably not less than 15% by mass, and in particular, not less than 20% by mass. Moreover, it is suitable that the upper limit of the content thereof is, for instance, 50% by mass.

In the present invention, it would be optimum that the ceramic powder of the invention is completely free of any particle (content thereof is 0%) having a particle size of greater than 7 µm and less than 12 µm, since the presence thereof is not necessary for the compact or dense packing structure of the powder comprising the foregoing particles having a binary-peak (two-peak) type particle size distribution or the particles having a triple-peak (three-peak) type particle size distribution as will be detailed below. Accordingly, the content thereof, if present, is not more than 18% (including 0%) and preferably at most 15% by mass (0%). The presence of the particles having a particle size of greater than 7 µm and less than 12 µm means the depth of the dale or bottom appearing between the foregoing first and second peaks and it is preferred that the smallest possible number of particles is present therein. This condition is quite important, but there has not yet been proposed any ceramic powder whose content of particles having a particle size of greater than 7 µm and less than 12 µm is controlled.

In the present invention, it is preferred that the ceramic powder has a particle size distribution having an additional third peak whose maximum particle size falls within the range of from 0.1 to 0.8 μm and preferably 0.2 to 0.7 μm. The particle group, which forms this third peak, would enter into the interstices present in the packing structure formed by the group of particles forming the first peak and the group of particles belonging to the second peak to thus make the packing structure of the particles more denser and to maintain their excellent moldability even when the filling rate of the resulting powder is further increased. Accordingly, this embodiment of the present invention would permit the preparation of an excellent composition which is almost free of any void and any deformation of wires. The content of the particles whose particle size falls within the range specified above is preferably not less than 3% by mass and particularly preferably not less than 10% by mass. Moreover, it is suitable that the upper limit of the content thereof is, for instance, 25% by mass.

In the ceramic powder according to the present invention, the amount of the oversize particles (the powder particles remaining on the sieve) as determined using the JIS Standard Sieve of 53 μm is preferably not more than 0.5% by mass (including 0%). More preferably, the amount of the oversize particles is not more than 0.3% by mass (including 0%). On the other hand, when the amount of the oversize particles exceeds 0.5% by mass, there would be observed such a tendency that the narrow interstice-filling up property of the resulting product is deteriorated.

It is preferred that the average sphericity of the ceramic powder according to the present invention is not less than 0.85 and preferably not less than 0.90. This accordingly results in the improvement of the narrow interstice-filling up property of the resulting composition and the further reduction of the viscosity of the same.

The particle size distribution of the ceramic powder of the present invention is one as determined by the laser diffraction-scattering type particle size distribution analyzing method. Such a laser diffraction-scattering type particle size distribution analyzer includes "Model LS-230" (the particle size channel has a width corresponding to log (μm) of 0.04) available from Beckman Coulter Company. When measuring the particle size distribution, water is used as a solvent, and the particles to be examined are subjected to a pre-treatment which comprises the step of dispersing them in water using the ultrasonic homogenizer for one minute at a power output of 200 W. In addition, the PIDS (Polarization Intensity Difference Scattering) concentration of the dispersion is set at a level ranging from 45 to 55% by mass. In this connection, the refractive index of water is assumed to be 1.33, while it is assumed that the refractive index of the sample powder may be identical to that of the material for the sample. For instance, the refractive index of amorphous silica is herein defined to be 1.50.

The term "maximum particle size" herein used means the median of the particle size range corresponding to the maximum value appearing in the frequency particle size distribution as determined according to the laser diffraction-scattering technique. For instance, when, in the cumulative particle size distribution, the cumulative value for the particle size of up to 20 μm is 50% by mass, that for the particle size of up to 24 μm is 65% by mass, and that for the particle size of up to 28 μm is 70% by mass, the particle size range showing the presence of a maximum value falls within the range of from 20 to 24 μm and thus the maximum particle size can be so calculated to be 22 μm, or the central value present between the values of 20 μm and 24 μm.

The amount of the oversize particles in the ceramic particles of the present invention can be determined by the use of a JIS Standard Sieve. Precisely weighed ceramic particles (10 g) are introduced into the Standard Sieve of 53 μm according to the JIS Specification, followed by shaking the particles for 5 minutes while spraying them with water, recovering, into a metallic container, the ceramic particles remaining on the sieve, drying the recovered particles and then determining the mass of the same. The amount of the ceramic powder remaining on the sieve is divided by the total mass of the ceramic powder used in this measurement to thus calculate the amount of the oversize particles in terms of the percentage thereof.

Moreover, the rate of amorphousness of the ceramic particles of the present invention can be determined by the use of a powder X-ray diffractometer (for instance, "Model Mini Flex" available from RIGAKU Co., Ltd.), in which the X-ray diffraction analysis is carried out at a 2θ (θ: angle of diffraction) of $CuK_\alpha$ beam ranging from 26 to 27.5 degrees, and the rate of amorphousness is determined on the basis of the intensity ratio of the specific diffraction peaks thus determined. For instance, in case of silica powder, the main peak for the crystalline silica appears at a 2θ of 26.7 degrees, while there is not observed any peak for the amorphous silica. When amorphous and crystalline silica particles are mixed in a sample, the peak appearing at 26.7 degrees observed for the crystalline silica has a height proportional to the rate of the crystalline silica present in the mixture and therefore, the ratio of the crystalline silica to the amorphous silica in the sample powder can be determined on the basis of the ratio of the X-ray intensity observed for the sample in question to that observed for the reference or standard sample of crystalline silica [(X-ray diffraction intensity observed for the sample)/(X-ray diffraction intensity observed for the crystalline silica)] and the rate of amorphousness of the sample can thus be determined by the following relation: Rate of Amorphousness (%)=[1−(the rate of the crystalline silica present in the mixture)×100].

The average sphericity of a sample can be determined according to the following method which comprises the steps of taking particle images using, for instance, a stereoscopic microscope (such as one available from Nikon Corporation under the trade name of "Model SMZ-10 Type"), then inputting the particle images into an image-analyzing device (such as one available from Mountech Company under the trade name of "MacView" and the average sphericity is then determined using the projected area (A) of each particle and the peripheral length (PM) thereof measured using the foregoing micrographs. If the area of a true circle corresponding to a specific peripheral length (PM) is assumed to be (B), the circularity of the particle is given by the relation or defined to be A/B. Accordingly, assuming that a true circle having a peripheral length is identical to that (PM) of the sample particles, the following relation: $B=\pi \times (PM/2\pi)^2$ can be derived, since the following relations: $PM=2\pi r$; and $B=\pi r^2$ hold true and accordingly, the circularity of each particle can be expressed by the following equation: Circularity=A/B=A×$4\pi/(PM)^2$. Thus, the average sphericity is herein defined to be the value obtained by calculating the circularity values for arbitrarily selected 200 particles prepared according to the foregoing method, determining the average thereof and then multiplying the same by itself.

The ceramic powder of the present invention can easily be prepared by, for instance, simply mixing particles having an average particle size ranging from 0.1 to 0.8 μm; those having an average particle size ranging from 2 to 7 μm; and those having an average particle size ranging from 12 to 30 μm. In addition, if the ceramic powder comprises spherical oxide powder such as spherical silica powder and/or spherical alumina powder, a desired ceramic powder product can be prepared according to, for instance, a method which comprises the steps of injecting a powdery raw material into a flame having a high temperature to thus give molten spherical particles and then recovering the particles using a collecting device such as a weight settling or sedimentation chamber, a cyclone, a bag filter and an electrostatic precipitator, while appropriately controlling the treating conditions such as particle size of the powdery raw material, the amount of the powder to be injected into the flame, and/or the temperature of the flame; or alternatively subjecting the recovered powder to such an operation as classification, sieving and mixing treatments; or the combination thereof.

The composition of the present invention is one comprising the ceramic powder according to the present invention, which is incorporated into at least one member selected from the group consisting of a resin and rubber. In this respect, it is preferred that the content of the ceramic powder in the composition ranges, for instance, from 10 to 99% by mass and preferably 30 to 95% by mass.

The resins usable herein include, for instance, epoxy resins, silicone resins, phenol resins, melamine resins, urea resins, unsaturated polyester, fluorine atom-containing resins, polyamides such as polyimides, polyamide-imides and polyether imides, polyesters such as polybutylene terephthalate and polyethylene terephthalate, polyphenylene sulfides, all aromatic polyesters, polysulfones, liquid crystalline polymers, polyether sulfones, polycarbonates, maleimide-modified resins, ABS resins, AAS (acrylonitrile-acrylic rubber/styrene) resins, and AES (acrylonitrile/ethylene/propylene/diene rubber-styrene) resins.

Among these resins, preferred as the semiconductor-sealing materials used herein are epoxy resins each comprising at least two epoxy groups in the molecule. Specific examples thereof include phenol novolak type epoxy resins, o-cresol novolak type epoxy resins, epoxidized products of novolak resins of phenols and aldehydes, glycidyl ester acid epoxy resins obtained through the reaction of glycidyl ethers such as bisphenol A, bisphenol F and bisphenol S, polybasic acids such as phthalic acid and dimeric acids and epichlorohydrin, linear aliphatic epoxy resins, alicyclic epoxy resins, heterocyclic epoxy resins, alkyl-modified multi-functional epoxy resins, β-naphthol novolak type epoxy resins, 1,6-dihydroxy naphthalene type epoxy resins, 2,7-dihydroxy naphthalene type epoxy resins, bis-hydroxy biphenyl type epoxy resins, and further epoxy resins into which halogen atoms such as bromine atoms were introduced for imparting a flame-retardant property thereto. Suitably used herein include o-cresol novolak type epoxy resins, bis-hydroxy biphenyl type epoxy resins, and epoxy resins carrying skeletons derived from naphthalene, among others, from the viewpoint of the resistance to humidity and the resistance to a solder-reflowing property.

As curing agents for the foregoing epoxy resins, there can be listed, for instance, novolak type resins each obtained by reacting at least one member selected from the group consisting of phenol, cresol, xylenol, resorcinol, chlorophenol, t-butyl-phenol, nonylphenol, isopropylphenol, and a mixture thereof with formaldehyde, paraformaldehyde or p-xylene in the presence of an oxidation catalyst, poly(p-hydroxy styrene) resins, bisphenol compounds such as bisphenol A and bisphenol S, tri-functional phenols such as pyrogallol and phloroglucinol, acid anhydrides such as maleic anhydride, phthalic anhydride and pyromellitic anhydride, and aromatic amines such as m-phenylene diamine, diamino-diphenyl methane and diamino-diphenyl sulfone. In this connection, it is also possible to use a curing accelerator, for instance, those specified above such as triphenylphosphine or 1,8-diaza-bi-cyclo-[5,4,0]-undecene-7 in order to accelerate the reaction between the epoxy resin with the curing agent.

The components specified below may, if necessary, be incorporated into the composition of the present invention. More specifically, examples of such additional components include a stress-reducing agent, for instance, a rubbery substance such as silicone rubber, polysulfide rubber, acrylic rubber, butadiene derived moiety-containing rubber, styrene derived moiety-containing block copolymer and saturated elastomer, a resinous substance such as a variety of thermoplastic resins and silicone resin, and a resin obtained by partially or completely modifying an epoxy resin or a phenol resin with amino-silicone, epoxy silicone or alkoxy silicone; a silane-coupling agent, for instance, an epoxy silane such as γ-glycidoxypropyltrimethoxysilane and β-(3,4-epoxycyclohexyl)ethyltrimethoxysilane, an amino-silane such as aminopropyltriethoxy silane, ureidopropyl triethoxy silane and N-phenylaminopropyltrimethoxysilane, a hydrophobic silane compound such as phenyl-trimethoxy silane, methyltrimethoxysilane, octadecyltrimethoxysilane and mercaptosilane; a surface-treating agent such as Zr-chelating agent, titanate-containing coupling agent and aluminum atom-containing coupling agent; an auxiliary flame-retardant such as $Sb_2O_3$, $Sb_2O_4$ and $Sb_2O_5$; a flame-retardant such as halogenated epoxy resin and phosphorus atom-containing compound; a coloring agent such as carbon black, iron oxide, dye and pigment; and further a release agent such as naturally occurring waxes, synthesized waxes, metal salts of linear fatty acids, acid amides, esters and paraffins.

The composition of the present invention can be prepared by, for instance, blending desired amounts of the foregoing starting materials in, for instance, a blender or a Henschel mixer; kneading the resulting blend in, for instance, a heated roll, a kneader, a single-screw or twin-screw extruder; cooling the kneaded product; and then pulverizing the cooled product.

The semiconductor-sealing material according to the present invention comprises an epoxy resin composition. When sealing a semiconductor device using the semiconductor-sealing material according to the present invention, the sealing methods usable herein include, for instance, mantle-molding techniques such as transfer molding technique and the technique using a multi-plunger.

EXAMPLES

Examples 1 to 5 and Comparative Examples 1 to 7

Pulverized naturally occurring silica as a raw material was molten and formed into spherical particles of the resulting melt by supplying the raw material into the flame formed through the combustion of LPG in the presence of oxygen gas using a device as disclosed in the example disclosed in JP-A-2001-233627 to thus form spherical amorphous silica particles. Thus, there were prepared 12 kinds of spherical amorphous particulate silica products A to L as detailed in the following Table 1, while variously adjusting, for instance, the flame-forming conditions, the particle size of the raw material used, the rate of supplying the raw material and the classification conditions. More specifically, the maximum particle size; the content of particles having a particle size of greater than 7 μm and less than 12 μm; and the ratio (F2/F1) of the frequency value F2 of the maximum particle size observed for the second peak to the frequency value F1 of the maximum particle size observed for the first peak were controlled by properly adjusting the raw material particle size, the condition for multiple sieving operation of the spherilized powder, and the mixing amounts of coarse particles, fine particles and ultrafine particles. The average sphericity of the resulting amorphous silica particles was controlled by appropriately adjusting the flame temperature and the amount of the raw material to be supplied.

The spherical amorphous silica powder products A to L were inspected for the rate of amorphousness and the average sphericity and all of these products were found to have a rate of amorphousness of not less than 99.5% and an average sphericity of not less than 0.85. Then, the particle size distributions of these powder products were analyzed and the maximum particle size, the content of particles having a particle size of greater than 7 μm and less than 12 μm, and the ratio (F2/F1) of the frequency value F2 of the maximum particle size observed for the second peak to the frequency value F1 of the maximum particle size observed for the first peak were calculated on the basis of the foregoing measurements. The maximum particle sizes observed for the particles having a particle size ranging from 12 to 30 μm, 2 to 7 μm and 0.1 to 0.8 μm are indicated as P1, P2 and P3 respectively and are summarized in Table 1.

To evaluate the characteristic properties of the resulting spherical amorphous silica powder products as the filler for the semiconductor-sealing material, the following ingredients were subjected to dry-blending, in a Henschel mixer: 89 parts (parts by mass; those appearing in the following description are shown in the same way also) of each of the spherical amorphous silica powder products A to L; 5.5 parts of 4,4'-bis(2,3-epoxypropoxy)-3,3',5,5'-tetramethyl-biphenyl type epoxy resin; 4.0 parts of a phenolic resin; 0.2 part of triphenylphosphine; 0.5 part of γ-glycidoxypropylmethoxysilane; 0.3 part of carbon black; and 0.5 part of carnauba wax, and the resulting mixture was then kneaded, with heating, in a unidirectionally engaged type twin-screw extrusion-kneading apparatus (screw diameter (D)=25 mm; kneading disc length of 10D mm; rotational number of paddle of 150 rpm; the rate of flow of 5 kg/h; and a heater temperature ranging from 105 to 110° C.). The kneaded product (the discharged product) was cooled in a cooling press, and then pulverized to give the corresponding semiconductor-sealing materials. Each semiconductor-sealing material thus prepared was inspected for the flowability, the narrow interstice-filling up property, and the degree of deformation of distributing wires according to the evaluation methods detailed below and the results thus obtained are summarized in the following Table 1:

(1) Determination of Flowability/Spiral Flow

The spiral flow value of each semiconductor-sealing material was determined using a transfer-molding machine equipped with a mold for determining the spiral flow according to the method specified in EMMI-1-66 (Epoxy Molding Material Institute; Society of Plastic Industry). The transfer molding conditions were as follows: the mold temperature of 175° C.; the molding pressure of 7.4 MPa; and the holding time of 90 seconds.

(2) Determination of Narrow Interstice-Filling Up Property

Two imitation chips each having a chip size of 8 mm×8 mm×0.3 mm were put in layers on the surface of a substrate for BGA via a die attach film, then they were connected to one another with gold wires and the resulting assembly was molded into a package size of 38 mm×38 mm×1.0 mm using each of the foregoing semiconductor-sealing materials in a transfer molding machine, followed by the after curing operation at a temperature of 175° C. for 8 hours to thus give 30 BGA imitational semiconductor elements. In this respect, the distance between the neighboring interstices on the chip was found to be 200 μm, the diameter of the gold wire was set at a level of φ30 μm, and the average length thereof was set at a level of 5 mm. The foregoing transfer molding operations were carried out at a mold temperature of 175° C., a molding pressure of 7.4 MPa and a holding time of 90 seconds. These 30 imitational semiconductor elements were visually inspected for the presence of any un-filled portion and the imitational semiconductors free of any un-filled portion were examined for the presence of any void using an ultrasonic flaw detector to thus calculate the average void number per imitational semiconductor for each semiconductor-sealing material. (3) Determination of Degree of Deformation of Gold Wire The gold wire portions of the foregoing imitational semiconductors were observed by a soft X-ray radiography device to thus determine the degree of deformation of the gold wires. In this connection, the degree of deformation is defined to be the maximum distance between the positions observed before and after the packaging operations and each experimental result was expressed in terms of the average of 12 measurements.

TABLE 1

| Ex. No. | | 1 | 2 | 3 | 4 |
|---|---|---|---|---|---|
| Symbol of Amorphous Silica Powder | | A | B | C | D |
| Maximum Particle | P1 (μm) | 19 | 14 | 19 | 19 |
| Size | P2 (μm) | 4.5 | 4.5 | 4.5 | 6.2 |
| | P3 (μm) | — | 0.5 | 0.3 | 0.9 |
| Content (%) of Particles (particle size (PD) <0.1 μm) | | 0 | 1 | 3 | 0 |
| Content (%) of Particles (PD: 0.1 to 0.8 μm) | | 0 | 12 | 11 | 7 |
| Content (%) of Particles (PD: >0.8 μm and <2 μm) | | 9 | 5 | 7 | 13 |
| Content (%) of Particles (PD: 2 μm to 7 μm) | | 26 | 22 | 17 | 31 |
| Content (%) of Particles (PD: >7 μm and <12 μm) | | 10 | 13 | 8 | 14 |
| Content (%) of Particles (PD: 12 μm to 30 μm) | | 46 | 39 | 48 | 30 |
| Content (%) of Particles (PD: >30 μm) | | 9 | 8 | 6 | 5 |
| Frequency value of | F1 (%) | 4.5 | 4.2 | 5.0 | 3.8 |
| maximum particle size | F2 (%) | 3.8 | 4.1 | 3.2 | 4.5 |
| | F2/F1 | 0.8 | 1.0 | 0.6 | 1.2 |
| Oversize Particles as Determined Using the JIS Standard Sieve of 53 μm (% by mass) | | 0.2 | 0.1 | 0.3 | 0.3 |
| Flowability/Spiral Flow (cm) | | 142 | 156 | 153 | 135 |
| Narrow Interstice-Filling up Property/Visual Observation (presence or absence of un-filled portions) | | No | No | No | No |
| Narrow Interstice-Filling up Property/Average No. of Voids (Number) | | 0 | 0 | 0 | 1 |

TABLE 1-continued

| Degree of Deformation of Gold Wire (mm) | | 0.11 | 0.05 | 0.07 | 0.15 |
|---|---|---|---|---|---|
| Ex. No. | | 5 | 1* | 2* | 3* |
| Symbol of Amorphous Silica Powder | | E | F | G | H |
| Maximum Particle Size | P1 (μm) | 27 | 9 | 36 | 19 |
| | P2 (μm) | 6.2 | 4.5 | 6.2 | 1.6 |
| | P3 (μm) | 0.3 | 0.5 | 0.5 | 0.3 |
| Content (%) of Particles (particle size(PD) <0.1 μm) | | 1 | 4 | 0 | 8 |
| Content (%) of Particles (PD: 0.1 to 0.8 μm) | | 9 | 14 | 6 | 15 |
| Content (%) of Particles (PD: >0.8 μm and <2 μm) | | 4 | 10 | 5 | 21 |
| Content (%) of Particles (PD: 2 μm to 7 μm) | | 25 | 24 | 16 | 10 |
| Content (%) of Particles (PD: >7 μm and <12 μm) | | 7 | 29 | 6 | 9 |
| Content (%) of Particles (PD: 12 μm to 30 μm) | | 36 | 16 | 25 | 35 |
| Content (%) of Particles (PD: >30 μm) | | 18 | 3 | 42 | 2 |
| Frequency value of maximum particle size | F1 (%) | 3.6 | 2.9 | 4.5 | 3.5 |
| | F2 (%) | 3.4 | 2.7 | 3.5 | 3.8 |
| | F2/F1 | 0.9 | 0.9 | 0.8 | 1.1 |
| Oversize Particles as Determined Using the JIS Standard Sieve of 53 μm (% by mass) | | 0.6 | 0.1 | 1.1 | 0.8 |
| Flowability/Spiral Flow (cm) | | 138 | 104 | 162 | 128 |
| Narrow Interstice-Filling up Property/Visual Observation (presence or absence of un-filled portions) | | No | No | Yes | No |
| Narrow Interstice-Filling up Property/Average No. of Voids (Number) | | 1 | 1 | — | 2 |
| Degree of Deformation of Gold Wire (mm) | | 0.18 | 1.18 | 0.27 | 0.34 |
| Ex. No. | | 4* | 5* | 6* | 7* |
| Symbol of Amorphous Silica Powder | | I | J | K | L |
| Maximum Particle Size | P1 (μm) | 19 | 14 | 19 | 19 |
| | P2 (μm) | 11 | 6.2 | 4.5 | 4.5 |
| | P3 (μm) | 0.9 | 0.3 | 0.5 | 0.5 |
| Content (%) of Particles (particle size (PD) <0.1 μm) | | 1 | 5 | 3 | 0 |
| Content (%) of Particles (PD: 0.1 to 0.8 μm) | | 3 | 10 | 13 | 8 |
| Content (%) of Particles (PD: >0.8 μm and <2 μm) | | 10 | 8 | 9 | 5 |
| Content (%) of Particles (PD: 2 μm to 7 μm) | | 14 | 27 | 34 | 16 |
| Content (%) of Particles (PD: >7 μm and <12 μm) | | 36 | 25 | 14 | 19 |
| Content (%) of Particles (PD: 12 μm to 30 μm) | | 31 | 23 | 24 | 51 |
| Content (%) of Particles (PD: >30 μm) | | 5 | 2 | 3 | 1 |
| Frequency value of Maximum particle size | F1 (%) | 3.1 | 3.4 | 3.5 | 6.3 |
| | F2 (%) | 3.3 | 3.2 | 5.4 | 2.2 |
| | F2/F1 | 1.1 | 0.9 | 1.5 | 0.3 |
| Oversize Particles as Determined Using the JIS Standard Sieve of 53 μm (% by mass) | | 0.4 | 0.2 | 0.3 | 0.3 |
| Flowability/Spiral Flow (cm) | | 106 | 115 | 124 | 140 |
| Narrow Interstice-Filling up Property/Visual Observation (presence or absence of un-filled portions) | | No | Yes | No | Yes |
| Narrow Interstice-Filling up Property/Average No. of Voids (Number) | | 5 | — | 2 | — |
| Degree of Deformation of Gold Wire (mm) | | 0.51 | 0.68 | 0.49 | 0.22 |

*Comparative Example

As will be clear from the comparison between the results of Examples and Comparative Examples, the ceramic powder according to the present invention would permit the preparation of a composition and, in particular, a semiconductor-sealing material, which is excellent in the narrow interstice-filling up property, and the moldability as compared with that prepared using the ceramic powder of Comparative Examples.

INDUSTRIAL APPLICABILITY

The ceramic powder according to the present invention can be used as, for instance, a semiconductor-sealing material used in, for instance, automobiles, portable electronic machinery and tools, personal computers, and household appliance; a laminated sheet on which semiconductor elements are mounted; putty; sealing agents; a variety of rubber materials; and filling materials (fillers) such as various kinds of engineering plastics. In addition to the semiconductor-sealing material, the composition containing the ceramic powder according to the present invention can further be used as, for instance, a prepreg obtained by impregnating, with the composition, for instance, a glass woven fabric, a glass non-woven fabric or other organic base materials and then curing the composition as well as various kinds of engineering plastics.

What is claimed is:

1. Ceramic powder having a multiple peak-frequency type particle size distribution which has at least two peaks, as determined according to the laser diffraction-scattering type particle size distribution analyzer, wherein the maximum particle size observed for the first peak falls within the range of from 12 to 30 μm; wherein the maximum particle size observed for the second peak falls within the range of from 2 to 7 μm;

wherein the content of the particles having a particle size of greater than 7 μm and less than 12 μm is 8 to 13% by mass;

wherein the content of the particles having a particle size falling within the range of 12 to 30 μm is 39 to 48% by mass;

wherein the content of the particles having a particle size falling within the range of 2 to 7 μm is 17 to 26% by mass;

and wherein the ratio (F2/F1) of the frequency value F2 of the maximum particle size observed for the second peak to the frequency value F1 of the maximum particle size observed for the first peak ranges from 0.6 to 1.0.

2. The ceramic powder of claim 1, having a particle size distribution having an additional third peak and the maximum particle size observed for the third peak falls within the range of from 0.1 to 0.8 μm.

3. The ceramic powder of claim 1 or 2, wherein the amount of the oversize particles as determined using the JIS Standard Sieve of 53 μm is not more than 0.5% by mass (including 0% by mass).

4. The ceramic powder of claim 1, wherein the ceramic powder is silica powder.

5. The ceramic powder of claim 2, wherein the ceramic powder is silica powder.

6. The ceramic powder of claim 3, wherein the ceramic powder is silica powder.

7. A composition comprising at least one of a resin and rubber; and ceramic powder of claim 1 incorporated into the resin and/or rubber.

8. A composition comprising at least one of a resin and rubber; and ceramic powder of claim 2 incorporated into the resin and/or rubber.

9. A composition comprising at least one of a resin and rubber; and ceramic powder of claim 3 incorporated into the resin and/or rubber.

10. A semiconductor-sealing material comprising the composition of claim 7 wherein at least one of the resin and the rubber is an epoxy resin.

11. A semiconductor-sealing material comprising the composition of claim 8 wherein at least one of the resin and the rubber is an epoxy resin.

12. A semiconductor-sealing material comprising the composition of claim 9 wherein at least one of the resin and the rubber is an epoxy resin.

* * * * *